US010848125B2

(12) United States Patent
Noto et al.

(10) Patent No.: US 10,848,125 B2
(45) Date of Patent: Nov. 24, 2020

(54) QUARTZ CRYSTAL RESONATOR UNIT

(71) Applicant: Murata Manufacturing Co., Ltd., Nagaokakyo (JP)

(72) Inventors: Kazuyuki Noto, Nagaokakyo (JP); Hiroaki Kaida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 689 days.

(21) Appl. No.: 15/692,075

(22) Filed: Aug. 31, 2017

(65) Prior Publication Data
US 2017/0366162 A1 Dec. 21, 2017

Related U.S. Application Data

(63) Continuation of application No. PCT/JP2016/056559, filed on Mar. 3, 2016.

(30) Foreign Application Priority Data

Mar. 3, 2015 (JP) ................. 2015-041441

(51) Int. Cl.
*H03H 9/19* (2006.01)
*H01L 23/02* (2006.01)
(Continued)

(52) U.S. Cl.
CPC ............. *H03H 9/19* (2013.01); *H01L 23/02* (2013.01); *H01L 23/04* (2013.01); *H01L 23/08* (2013.01);
(Continued)

(58) Field of Classification Search
CPC ...... H03H 9/19; H03H 9/0519; H03H 9/0595; H03H 9/14594; H01L 41/04
(Continued)

(56) References Cited

U.S. PATENT DOCUMENTS 6,531,806 B1  3/2003  Daidai
8,810,112 B2  8/2014  Takahashi
(Continued)

FOREIGN PATENT DOCUMENTS

JP  H11-168345 A  6/1999
JP  2001-60843 A  3/2001
(Continued)

OTHER PUBLICATIONS

International Search Report issued in International Application No. PCT/JP2016/056559, dated May 24, 2016.
(Continued)

*Primary Examiner* — Derek J Rosenau
(74) *Attorney, Agent, or Firm* — Arent Fox LLP

(57) ABSTRACT

A quartz crystal resonator unit including a quartz crystal resonator having a quartz crystal blank, a frame surrounding an outer periphery of the quartz crystal blank, and coupling members connecting the frame to the quartz crystal blank. Moreover, a lid member and a base member are attached to the frame and seal the resonator. One or more outer electrodes is formed over end surfaces of the frame, the lid member, and the base member on a side where the coupling members are coupled. The one or more outer electrodes has a machinery quality factor smaller than that of the frame.

19 Claims, 12 Drawing Sheets

(51) Int. Cl.
*H01L 23/08* (2006.01)
*H01L 23/04* (2006.01)
*H03H 9/05* (2006.01)
*H01L 41/04* (2006.01)
*H03H 9/145* (2006.01)

(52) U.S. Cl.
CPC ............ *H01L 41/04* (2013.01); *H03H 9/0519* (2013.01); *H03H 9/0595* (2013.01); *H03H 9/14594* (2013.01)

(58) Field of Classification Search
USPC .................................................. 310/348, 368
See application file for complete search history.

(56) References Cited

U.S. PATENT DOCUMENTS

| | | | |
|---|---|---|---|
| 2012/0098390 A1 | 4/2012 | Takahashi | |
| 2013/0320809 A1* | 12/2013 | Takahashi | H01L 41/053 310/344 |

FOREIGN PATENT DOCUMENTS

| | | |
|---|---|---|
| JP | 2006-211310 A | 8/2006 |
| JP | 2010-252051 A | 11/2010 |
| JP | 2012-90081 A | 5/2012 |
| JP | 2013-51560 A | 3/2013 |

OTHER PUBLICATIONS

Written Opinion of the International Searching Authority issued in International Application No. PCT/JP2016/056559, dated May 24, 2016.
International Search Report issued in International Application No. PCT/JP2016/056559, dated May 11, 2016.
Written Opinion of the International Searching Authority issued in International Application No. PCT/JP2016/056559, dated May 11, 2016.

* cited by examiner

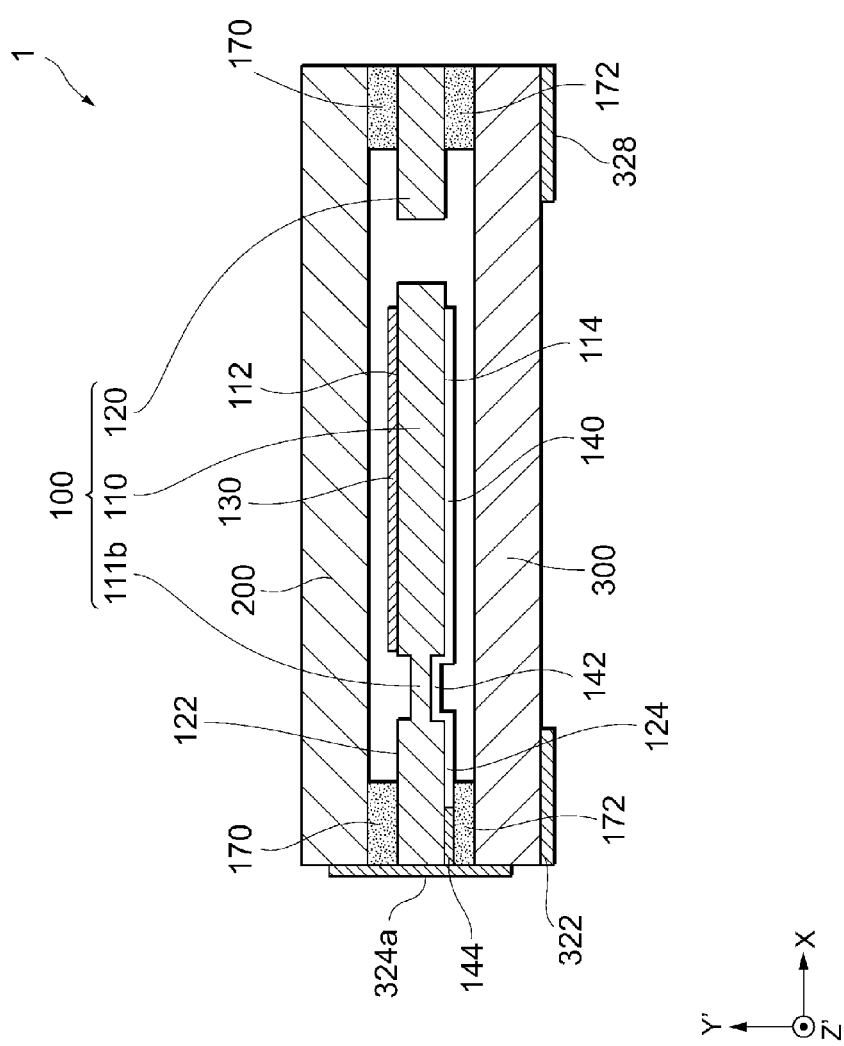

QUARTZ CRYSTAL RESONATOR UNIT

CROSS REFERENCE TO RELATED APPLICATIONS

The present application is a continuation of PCT/JP2016/056559 filed Mar. 3, 2016, which claims priority to Japanese Patent Application No. 2015-041441, filed Mar. 3, 2015, the entire contents of each of which are incorporated herein by reference.

TECHNICAL FIELD

The present disclosure relates to a quartz crystal resonator unit.

BACKGROUND

As a source of reference signals used in oscillation devices, band-pass filters, and the like, quartz crystal resonator units that produce thickness shear vibration as a principal vibration are widely used. A quartz crystal resonator unit configured as disclosed in Patent Document 1 (identified below) is known, in which a lid unit and a base unit are individually bonded by a sealing material to the front and back principal surfaces of a piezoelectric substrate made of an AT-cut quartz crystal material. In this quartz crystal resonator unit, outer electrodes on the base unit are electrically connected to extended electrodes on the piezoelectric substrate through through-electrodes on castellations formed at four corners of the base unit.

In this configuration, excitation vibration leaking out of the piezoelectric substrate and propagating through the sealing material to upper and lower substrates (i.e., the lid unit and the base unit) is reflected at the end face (outer periphery) of each substrate, and the influence of the reflected waves may deteriorate the characteristics of the piezoelectric substrate. That is, in the conventional configuration, the occurrence of unwanted vibration may damage the quality of the quartz crystal resonator unit.

Patent Document 1: Japanese Unexamined Patent Application Publication No. 2012-90081.

SUMMARY

The present disclosure has been made in view of the technical limitations of conventional designs described above. An object of the present disclosure is to suppress unwanted vibration and thereby improves quality of the quartz crystal resonator unit.

Accordingly, a quartz crystal resonator unit according to an exemplary embodiment is provided that includes a quartz crystal resonator including a quartz crystal blank having a first excitation electrode and a second excitation electrode on a first surface and a second surface, respectively, thereof, a frame configured to surround an outer periphery of the quartz crystal blank, and a coupling member configured to couple the frame to the quartz crystal blank, Moreover, a lid member is disposed to face the first surface of the quartz crystal blank and joined to an entire circumference of the frame, and a base member is disposed to face the second surface of the quartz crystal blank and joined to the entire circumference of the frame. In the exemplary aspect, the base member has a plurality of outer electrodes electrically connectable to an external unit and disposed on a surface of the base member opposite a surface thereof facing the quartz crystal resonator. The plurality of outer electrodes include a first outer electrode electrically connected to the first excitation electrode and a second outer electrode electrically connected to the second excitation electrode. The lid member and the base member are each made of quartz crystal or glass according to an exemplary aspect. Moreover, at least one of the first and second outer electrodes is formed over end surfaces of the frame, the lid member, and the base member on a side where the coupling member is disposed, and has a machinery quality factor Qm smaller than that of the frame.

In the configuration described above, an outer electrode is formed over the end surfaces of the frame, the lid member, and the base member on the side where the coupling member is disposed, and the outer electrode has a machinery quality factor Qm smaller than that of the frame. Thus, part of vibration leaking out of the quartz crystal resonator propagates through the end portions of the lid member and the base member to the outer electrode, in which vibration energy is consumed. Therefore, since waves attenuated by the outer electrode are reflected, it is possible to relieve or disperse the influence of the reflected waves, reduce deterioration of the characteristics of the quartz crystal resonator, and improve quality of the quartz crystal resonator unit.

In the quartz crystal resonator unit disclosed herein, at least one of the first and second outer electrodes may be formed to reach an upper edge of the end surface of the lid member.

Moreover, in the quartz crystal resonator unit disclosed herein, at least one of the first and second outer electrodes may be formed along the end surface of the lid member to reach and extend over a surface of the lid member opposite a surface thereof facing the quartz crystal resonator.

In the quartz crystal resonator unit according to another exemplary aspect, the frame may have a connection electrode electrically connected to the first excitation electrode or to the second excitation electrode, the connection electrode being in contact with an outer edge of the frame; and at least one of the first and second outer electrodes may be connected to the connection electrode on a side thereof adjacent to the end surfaces of the frame, the lid member, and the base member.

In the quartz crystal resonator unit according to another exemplary aspect, the frame, the lid member, and the base member may be substantially rectangular in outer shape in plan view.

In the quartz crystal resonator unit according to another exemplary aspect, the end surfaces of the frame, the lid member, and the base member may be flush with each other at least on the side where the coupling member is disposed, and at least one of the first and second outer electrodes may cover the end surfaces flush with each other.

In the quartz crystal resonator unit according to another exemplary aspect, at least one of the first and second outer electrodes may be formed over the end surfaces of the frame, the lid member, and the base member on a corresponding one of two sides of the frame, where the two sides are adjacent to the side where the coupling member is disposed.

In the quartz crystal resonator unit according to another exemplary aspect, the lid member and the base member may each be a flat plate.

In the quartz crystal resonator unit according to another exemplary aspect, a thickness of a portion of the quartz crystal blank, the portion excluding the first and second excitation electrodes, may be equal to a thickness of the frame.

In the quartz crystal resonator unit according to another exemplary aspect, the machinery quality factor Qm of the at least one of the first and second outer electrodes may be smaller than those of both the lid member and the base member.

In the quartz crystal resonator unit according to another exemplary aspect, an internal space surrounded by the frame, the lid member, and the base member may be a vacuum space.

The presently disclosed quartz crystal resonator unit advantageously suppress unwanted vibration and thereby improve quality of the quartz crystal resonator unit.

BRIEF DESCRIPTION OF DRAWINGS

FIG. 2B is a cross-sectional view taken along line IIB-IIB of FIG. 1.

DETAILED DESCRIPTION

Figure 1:
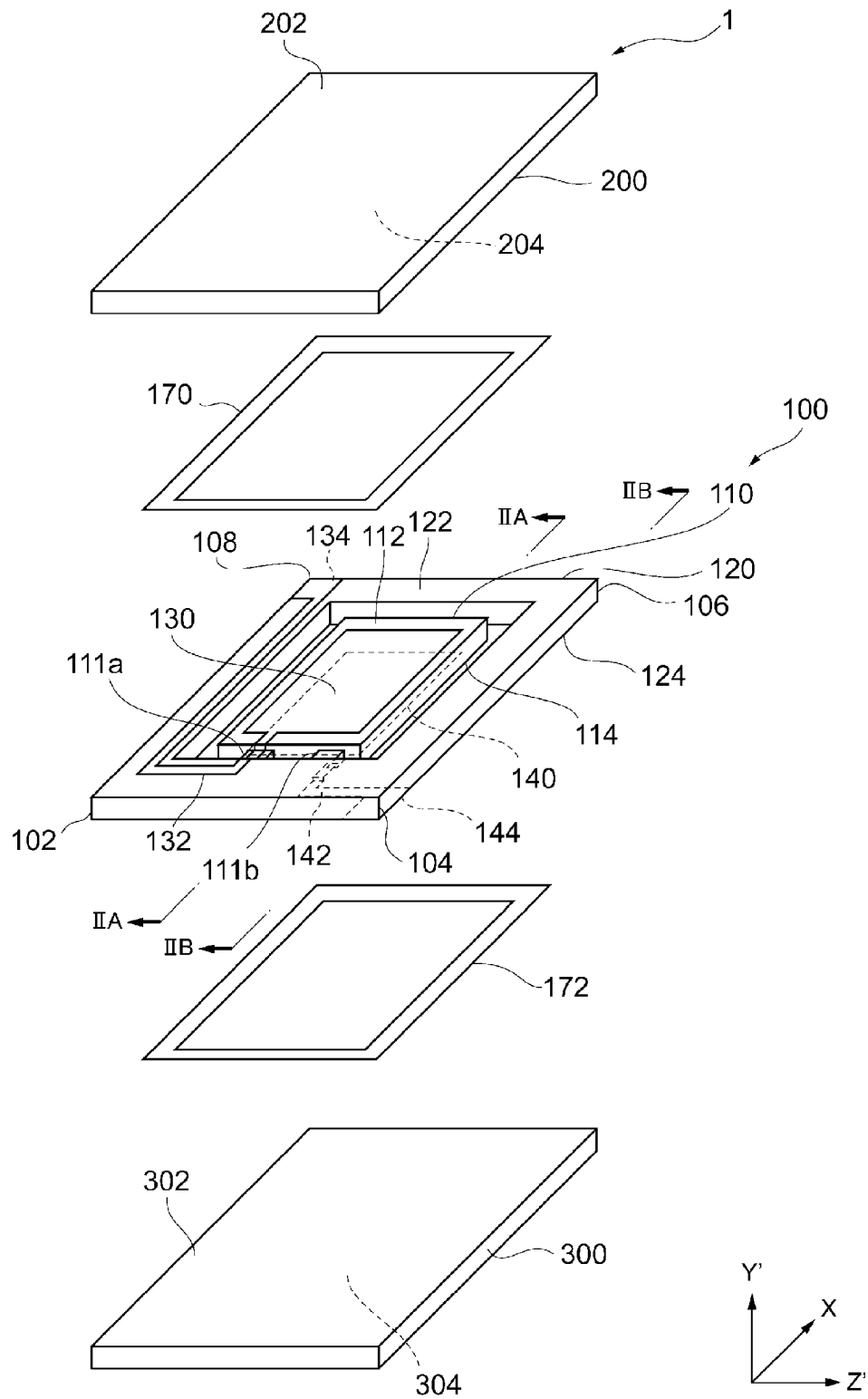
FIG. 1 is an exploded perspective view of a quartz crystal resonator unit according to a first exemplary embodiment.

Exemplary embodiments of the present disclosure will now be described. In the following description of the drawings, the same or similar components are denoted by the same or similar reference numerals. It is noted that the drawings are given for illustrative purposes, and the dimensions and shapes of parts are schematically shown. The technical scope of the exemplary embodiments of the present disclosure should not be interpreted as being limited to the specific embodiments described below.

First Embodiment

Figure 2A:
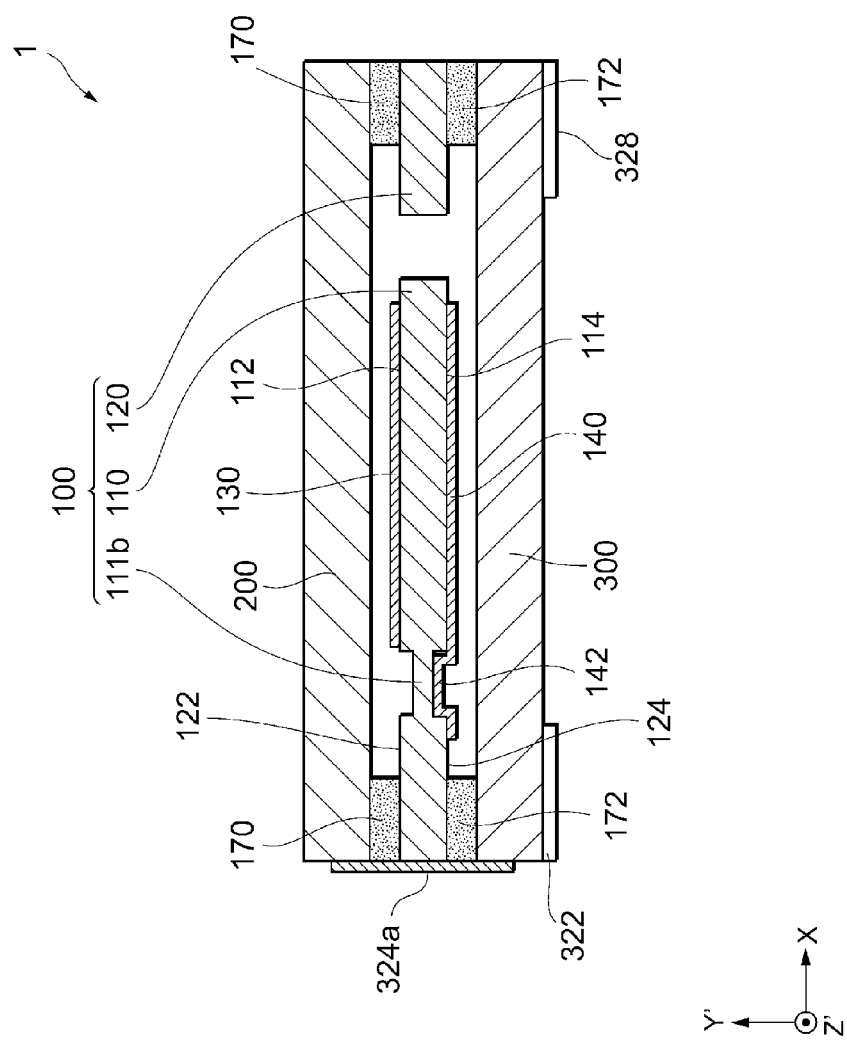
FIG. 2A is a cross-sectional view taken along line IIA-IIA of FIG. 1.
Figure 3:
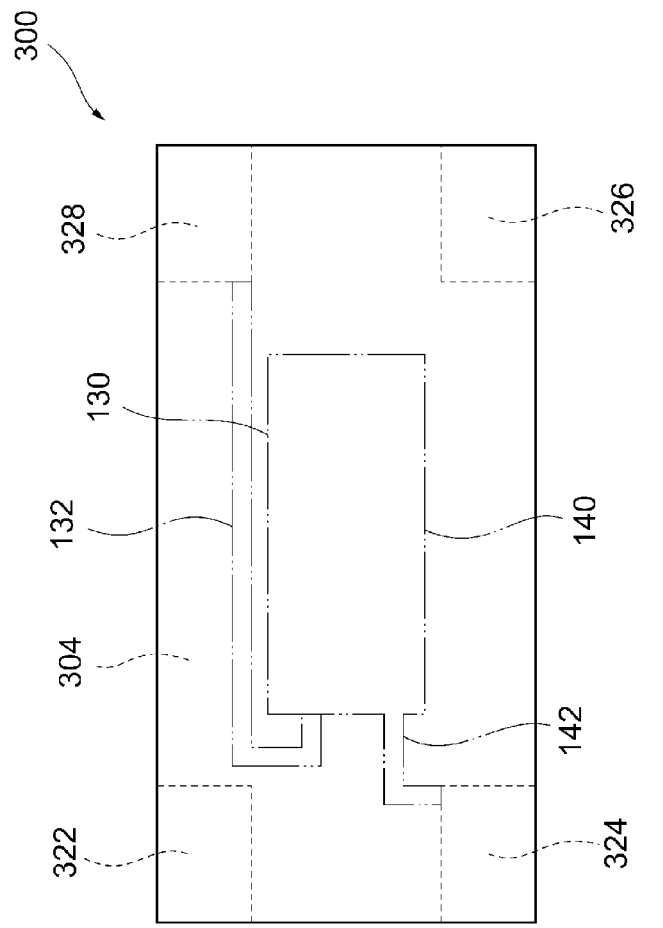
FIG. 3 is a plan view of a base member according to the first exemplary embodiment.
Figure 3:
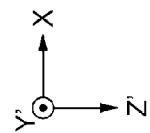
Figure 4:
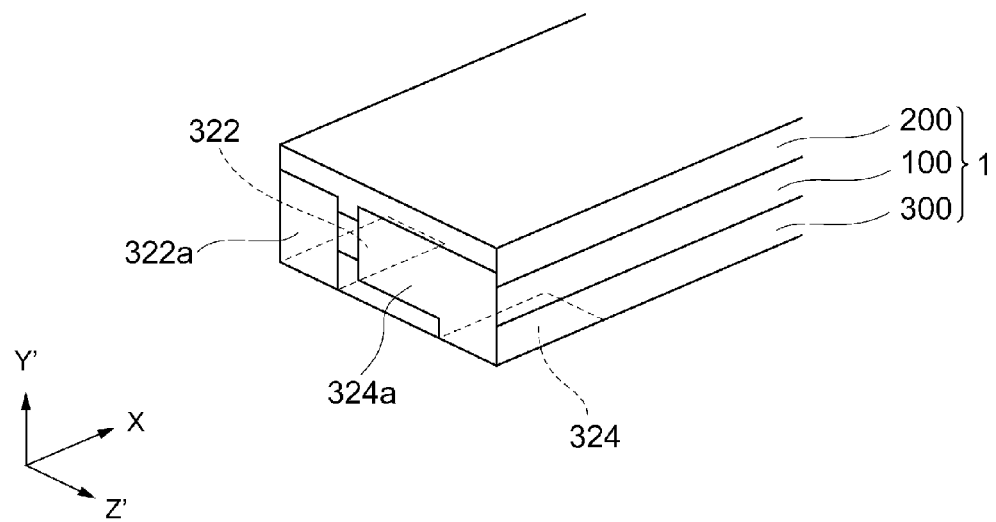
FIG. 4 is a perspective view of the quartz crystal resonator unit according to the first quartz crystal resonator unit embodiment.

A quartz crystal resonator unit according to a first exemplary embodiment will be described with reference to FIGS. 1 to 4. FIG. 1 is an exploded perspective view of a quartz crystal resonator unit according to the present embodiment. FIG. 2A is a cross-sectional view taken along line IIA-IIA of FIG. 1. FIG. 2B is a cross-sectional view taken along line IIB-IIB of FIG. 1. FIG. 3 is a plan view of a base member. FIG. 4 is a perspective view of the quartz crystal resonator unit. It is noted that outer electrodes on the base member are not shown in FIG. 1.

As illustrated in FIG. 1, a quartz crystal resonator unit 1 according to the present embodiment generally includes a quartz crystal resonator 100, a lid member 200, and a base member 300.

The quartz crystal resonator 100 can be formed, for example, by an AT-cut quartz crystal substrate. The X-axis, the Y-axis, and the Z-axis are crystal axes of a synthetic quartz crystal. When axes obtained by rotating the Y-axis and the Z-axis by 35°15'±1'30" about the X-axis in the direction from the Y-axis to the Z-axis are defined as the Y'-axis and the Z'-axis, respectively, the AT-cut quartz crystal substrate is cut out such that its principal surfaces lie in planes parallel to the plane defined by the X-axis and the Z'-axis. Quartz crystal resonators using an AT-cut quartz crystal substrate have very high frequency stability over a wide range of temperatures, have good aging characteristics, and can be manufactured at low cost. The AT-cut quartz crystal resonators are often used as resonators having a thickness shear mode as a principal mode of vibration. Hereinafter, each component of the quartz crystal resonator unit of the exemplary embodiments will be described with reference to the axial directions of AT-cut. The piezoelectric vibrator 100 may be formed by a quartz crystal substrate with a cut angle other than the AT-cut angle.

The lid member 200 and the base member 300 form a case or package for storing part of the quartz crystal resonator 100 (i.e., for storing the quartz crystal blank). The quartz crystal resonator 100, the lid member 200, and the base member 300 have substantially the same dimensions and outer shape (e.g., substantially rectangular outer shape) in plan view. When a manufacturing technique that involves packaging a quartz crystal blank while it is still in a wafer state (also called wafer-level chip size packaging (CSP)) is used, a three-layer structure composed of a wafer corresponding to the lid member, a wafer corresponding to the quartz crystal resonator, and a wafer corresponding to the base member, is cut by a dicing machine into individual quartz crystal resonator units 1. The quartz crystal resonator 100, the lid member 200, and the base member 300 thus have substantially the same dimensions and outer shape.

The quartz crystal resonator 100 includes a quartz crystal blank 110, a frame 120 configured to surround the outer periphery of the quartz crystal blank 110, and coupling members 111a and 111b configured to couple the quartz crystal blank 110 to the frame 120. The quartz crystal blank 110, the frame 120, and the coupling members 111a and 111b may all be formed from an AT-cut quartz crystal substrate. In the exemplary aspect, the quartz crystal resonator 100 has a long-side direction parallel to the X-axis direction, a short-side direction parallel to the Z'-axis direction, and a thickness direction parallel to the Y'-axis direction. In the example illustrated in FIG. 1, the coupling members 111a and 111b are both disposed at one end of the quartz crystal blank 110 in the long-side direction (i.e., disposed on the negative side of the X-axis). That is, the quartz crystal blank 110 and the frame 120 are spaced apart and coupled together by the coupling members 111a and 111b. Although the two coupling members are arranged at one end in the long-side direction in the example illustrated in FIG. 1, the number and arrangement of the coupling members are not particularly limited.

The shape of corners 102, 104, 106, and 108 of the quartz crystal resonator 100 is not particularly limited, and each corner may have no notch as illustrated in FIG. 1. In a variation to the example illustrated in FIG. 1, each corner may have a notched side face formed by cutting part of the corner into a cylindrically curved shape (or castellated shape). In this case, each corner of the lid member 200 and the base member 300 may also be formed to have a notched side face. Such notched side faces are often formed in association with using the manufacturing technique called wafer-level CSP, which involves packaging a quartz crystal blank while it is still in a wafer state. In this case, each notched side face of the corresponding corner of the quartz crystal resonator 100, the lid member 200, and the base member 300 extends along the Y'-axis direction. Note that the notched side face may have a shape other than the cylindrically curved shape.

First and second excitation electrodes 130 and 140 are formed on the respective principal surfaces of the quartz crystal blank 110. A portion of the quartz crystal blank 110 where the first and second excitation electrodes 130 and 140 face each other is an excitation portion (which excludes the first and second excitation electrodes 130 and 140). The thickness of the quartz crystal blank 110 is not particularly limited. As illustrated in FIG. 2A, the thickness of the excitation portion of the quartz crystal blank 110 may be substantially the same as the thickness of the frame 120. The quartz crystal resonator 100 with such a flat plate-like structure does not easily allow diffusion of vibration and is more vulnerable to the influence of vibration leakage, as compared to that with a mesa structure. Applying the configuration of the present embodiment to the flat plate-like structure is effective, as it suppresses unwanted vibration caused by leaking vibration. In the direction normal to the principal surfaces of the quartz crystal blank 110, the thickness of the coupling members 111a and 111b may be thinner than the thickness of a quartz crystal portion, which is the excitation portion of the quartz crystal blank 110. The quartz crystal blank 110 thus has a structure similar to the mesa structure. Accordingly, the mechanical strength of the quartz crystal resonator 100 can be maintained by the thickness of the frame 120, and vibration energy is confined more effectively by the coupling members 111a and 111b.

The first excitation electrode 130 is formed on a first surface 112 of the quartz crystal blank 110 (i.e., on the surface on the positive side of the Y'-axis), and the second excitation electrode 140 is formed on a second surface 114 of the quartz crystal blank 110 (i.e., on the surface on the negative side of the Y'-axis). The first and second excitation electrodes 130 and 140 are disposed, as a pair of electrodes, to substantially or entirely overlap. An extended electrode 132 electrically connected to the first excitation electrode 130 is formed on a first surface 122 of the frame 120. The extended electrode 132 extends from the first excitation electrode 130, passes through the coupling member 111a and extends over the first surface 122 of the frame 120 toward the corner 108, and is electrically connected to a connection electrode 134 formed on a second surface 124 of the frame 120. Similarly, an extended electrode 142 electrically connected to the second excitation electrode 140 is formed on the second surface 124 of the frame 120. The extended electrode 142 extends from the second excitation electrode 140, passes through the coupling member 111b and extends over the second surface 124 of the frame 120 toward the corner 104, and is electrically connected to a connection electrode 144 formed on the second surface 124 of the frame 120. In the example illustrated in FIG. 1, the connection electrodes 134 and 144 electrically connected to the first and second excitation electrodes 130 and 140, respectively, are disposed at the opposite corners 108 and 104, respectively, of the frame 120. Moreover, the connection electrodes 134 and 144 are in contact with the outer edge of the frame 120.

The arrangement of the connection electrodes 134 and 144 electrically connected to the first and second excitation electrodes 130 and 140 is not particularly limited in the exemplary embodiment. For example, the connection electrodes 134 and 144 may be disposed at the respective two corners 102 and 104 on the negative side of the X-axis. The connection electrodes 134 and 144 may each be disposed in a region outside the corners of the frame, as long as they are in contact with the outer edge of the frame 120.

The electrodes, including the first and second excitation electrodes 130 and 140, described above are each composed of, for example, a chromium (Cr) layer serving as a base layer and a gold (Au) layer formed on the surface of the chromium layer. It should be appreciated that the materials of the electrodes are not limited to the specific materials described herein.

In the exemplary embodiment, the lid member 200 is disposed adjacent to the first surface 122 of the frame 120 so as to face the first surface 112 of the quartz crystal blank 110, and the base member 300 is disposed adjacent to the second surface 124 of the frame 120 so as to face the second surface 114 of the quartz crystal blank 110. The lid member 200, the quartz crystal resonator 100, and the base member 300 are thus stacked in this order to form a three-layer structure. The lid member 200 has a first surface 202 and a second surface 204 opposite the first surface 202 and facing the quartz crystal resonator 100. The base member 300 has a first surface 302 facing the quartz crystal resonator 100, and a second surface 304 opposite the first surface 302. The second surface 304 of the base member 300 may be a mounting surface electrically connected to an external unit.

As illustrated in FIG. 3, the second surface 304 of the base member 300 has outer electrodes 322, 324, 326, and 328 formed at the respective corners thereof. Specifically, the outer electrodes 322 and 324 are formed at two corners on the negative side of the X-axis, and the outer electrodes 326 and 328 are formed at two corners on the positive side of the X-axis. When the quartz crystal resonator 100 is mounted onto the base member 300, the outer electrode 328 is electrically connected through the extended electrode 132 and the connection electrode 134 to the first excitation electrode 130, and the outer electrode 324 is electrically connected through the extended electrode 142 and the connection electrode 144 to the second excitation electrode 140. The remaining outer electrodes 322 and 326 may be dummy electrodes (also called floating electrodes) which are not electrically connected to either of the first and second excitation electrodes 130 and 140. The dummy electrodes may be connected to terminals which are disposed on a substrate onto which the quartz crystal resonator unit 1 is to be mounted and are not connected to any electronic elements. It is noted that this applies to other outer electrodes serving as dummy electrodes. Although the outer electrodes 324 and 328 electrically connected to the first and second excitation electrodes 130 and 140 are arranged at opposite corners of the base member 300 in the example illustrated in FIG. 3, the arrangement is not limited to this and they may be arranged at other corners. When each corner of the base member 300 has a notched side face with a castellated shape or the like, each outer electrode at the corresponding corner may extend from the second surface 304 of the base member 300 to reach the notched side face. It is further noted that FIG. 3 is a plan view of the base member 300 as viewed from the side where the quartz crystal resonator is mounted.

The outer electrodes 322, 324, 326, and 328 are made of, for example, chromium (Cr) and gold (Au), and are formed by sputtering or plating. The materials of the outer electrodes 322, 324, 326, and 328 are not limited to those described above, and other known conductive materials may be used. It should be appreciated that known methods, other than those described above, may be used to form the outer electrodes 322, 324, 326, and 328. Although the present embodiment presents a four-terminal structure composed of four outer electrodes, the number of outer electrodes is not particularly limited. For example, a two-terminal structure composed of two outer electrodes is also applicable (see the second embodiment below for the two-terminal structure).

The lid member 200 and the base member 300 may each be a flat plate-like substrate. The lid member 200 and the base member 300 may be made of glass (e.g., silicate glass, or a material primarily composed of a material other than silicate and exhibiting a glass transition phenomenon when the temperature rises), or may be made of quartz crystal (e.g., AT-cut quartz crystal), which is the same material as the quartz crystal resonator 100. When the lid member 200 and the base member 300 are each a flat plate-like substrate, vibration based on excitation vibration leaking out through the coupling members to the lid member 200 and the base member 300 easily propagates to the quartz crystal resonator 100. Also, when the lid member 200 and the base member 300 can be of the same material as the quartz crystal resonator 100, vibration easily propagates from one to the other. That is, since unwanted vibration is required to be suppressed in either of these cases, using the configuration according to the present embodiment is effective.

As illustrated in FIGS. 1 and 2A, the lid member 200 is joined to the entire circumference of the first surface 122 of the frame 120, with a first sealing member 170 interposed therebetween. Similarly, the base member 300 is joined to the entire circumference of the second surface 124 of the frame 120, with a second sealing member 172 interposed therebetween. With the first and second sealing members 170 and 172 on the entire circumferences of the respective surfaces of the frame 120, the quartz crystal blank 110 is hermetically sealed in an internal space (cavity). The internal space is preferably in a vacuum state where pressure is lower than atmospheric pressure, so as to reduce aging of the first and second excitation electrodes 130 and 140 caused by oxidation. The material of the first and second sealing members 170 and 172 is not particularly limited in the exemplary embodiments, as long as it allows the joint surfaces of components to be joined together and also allows the internal space to be hermetically sealed. For example, the material may be a glass binder for bonding of glass, such as low-melting glass (e.g., lead-borate glass or tin-phosphate glass), or may be a resin adhesive. Joining the frame 120 to the lid member 200 and the base member 300 using an adhesive material containing a resin material having a machinery quality factor Qm smaller than that of a glass binder is preferable, because vibration propagating from the frame 120 through the first and second sealing members 170 and 172 is more significantly consumed by the adhesive material. When the first and second sealing members 170 and 172 each have a predetermined recess formed inward from the end face of the quartz crystal resonator, an outer electrode 324a on the end face fills the predetermined recess. This is preferable because this increases the joint area between wires extended to the end face and the outer electrode 324a, and thus increases the joint strength. Additionally, when the outer electrode 324a is directly in contact with the first or second sealing member 170 or 172, a difference in acoustic impedance is smaller than that when there is an air space between the outer electrode 324a and the first or second sealing member 170 or 172, and it is thus possible to suppress reflection of vibration.

In the present embodiment, as illustrated in FIG. 2A, the outer electrode 324a (electrically connected to the second excitation electrode 140) is formed over the end surfaces of the frame 120, the lid member 200, and the base member 300 on the negative side of the X-axis where the coupling member 111b is coupled to the frame 120, and the outer electrode 324a has the machinery quality factor Qm smaller than that of the frame 120. Thus, vibration leaking out of the quartz crystal blank 110 of the quartz crystal resonator 100 is consumed, for example, by thermal energy in the outer electrode 324a having the machinery quality factor Qm smaller than that of the frame 120. Since this attenuates the vibration energy of waves propagating to the outer electrode 324a and reflected from the end face of the outer electrode 324a, the influence of the reflected waves is relieved or dispersed. It is thus possible to reduce deterioration of the characteristics of the quartz crystal resonator 100 caused by unwanted vibration. In particular, since vibration of the quartz crystal resonator 100 leaks through the coupling members 111a and 111b and the frame 120 to the lid member 200 and the base member 300, unwanted vibration caused by reflected waves is effectively suppressed by forming the outer electrode 324a over the end surfaces of the components on at least one side of the frame 120 to which the coupling members 111a and 111b are coupled. Moreover, the Qm of the outer electrode 324a is preferably smaller than that of any of the frame 120, the lid member 200, and the base member 300, as this configuration increases the attenuation of vibration energy leaking out of the quartz crystal blank 110.

As illustrated in FIG. 2B, the outer electrode 324a is connected, on the side thereof adjacent to the end surfaces of the frame 120, the lid member 200, and the base member 300, to the connection electrode 144 (electrically connected through the extended electrode 142 to the second excitation electrode 140) in contact with the outer edge of the frame 120. Also, as illustrated in FIG. 2B, the end surfaces of the frame 120, the lid member 200, and the base member 300 are flush with each other on the side where the coupling member 111b is disposed, and the outer electrode 324a covers the end surfaces flush with each other. This reduces the occurrence of leakage through boundaries between the frame 120, the lid member 200, and the base member 300 forming a multilayer structure, and thus improves resistance to leakage.

The outer electrode 324a may be formed, for example, by sputter deposition of a conductive layer, or by application of conductive plating after sputtering. The outer electrode 324a is formed over the end surfaces of the lid member 200, the quartz crystal resonator 100, and the base member 300. Specifically, with the manufacturing technique called wafer-level CSP described above, wafers are bonded together, with the first and second sealing members 170 and 172 interposed therebetween, and cut by a dicing machine into multilayer bodies each composed of the lid member 200, the quartz crystal resonator 100, and the base member 300. The outer electrode 324a is then formed on an exposed surface (end surface) of the multilayer body.

More specifically, in the example illustrated in FIG. 4, the outer electrode 324a and an outer electrode 322a are formed in the Y'Z' plane (which is a plane defined by the Y'-axis and the Z'-axis; the same applies to other planes described below) in the quartz crystal resonator unit 1 on the negative side of the X-axis. The outer electrode 324a is electrically connected to the outer electrode 324 electrically connected to the second excitation electrode 140, and the outer electrode 322a is electrically connected to the outer electrode 322 that is a dummy electrode. The Y'Z' plane in the quartz crystal resonator unit 1 is formed by the end surfaces of the lid member 200, the quartz crystal resonator 100, and the base member 300, and the outer electrodes 324a and 322a each extend in a region extending over the end surfaces of the lid member 200, the quartz crystal resonator 100, and the base member 300. The outer electrodes 324a and 322a are spaced apart so that they are not electrically connected to each other. The outer electrodes 324a and 322a are both disposed at a predetermined distance from the edge in the Y'Z' plane of the quartz crystal resonator unit 1 on the positive side of the Y'-axis (i.e., from the upper edge of the lid member 200). That is, the end surface of the lid member 200 is exposed in an area adjacent to the upper edge.

In this configuration, the outer electrode 324a (and the outer electrode 322a) is formed in part of the Y'Z' plane (including the region extending over the end surfaces of the lid member 200, the quartz crystal resonator 100, and the base member 300) in the quartz crystal resonator unit 1. Therefore, part of vibration leaking through the coupling members 111a and 111b of the quartz crystal resonator 100 to the lid member 200 and the base member 300 propagates from the end portions of the lid member 200 and the base member 300 to the outer electrode 324a, where reflected waves are attenuated. As a result, the influence of the reflected waves can be relieved or reduced. To reduce reflection that occurs at an end portion of the quartz crystal resonator unit 1 (frame 120), it is preferable, for example, that the outer electrode 324a be composed of a first electrode layer on the surface of the end portion and a second electrode layer outside the first electrode layer, and that the acoustic impedance of the first electrode layer be between the acoustic impedances of the second electrode layer and quartz crystal.

The quartz crystal resonator unit 1 according to the present embodiment thus reduces the influence of reflected waves, suppresses unwanted vibration caused by the influence of reflected waves, and thereby improves quality of the quartz crystal resonator unit.

The layer structure and materials of the outer electrodes 324a and 322a formed in the Y'Z' plane in the quartz crystal resonator unit 1 may be the same as those of the outer electrodes 324 and 322 formed on the second surface of the base member 300, or different configurations may be used appropriately for the purposes of attenuating reflected waves and achieving good electrical connection.

In the exemplary embodiment described above, the two coupling members 111a and 111b for coupling the quartz crystal blank 110 are disposed on the same side (i.e., on the negative side of the X-axis). Alternatively, for example, one of the two coupling members may be disposed on the negative side of the X-axis and the other coupling member may be disposed on the positive side of the X-axis. In this case, an outer electrode may be formed over the end surfaces of the frame 120, the lid member 200, and the base member 300 on at least one side where one of the coupling members is disposed. In this case, the outer electrode is preferably formed over the end surfaces on one side adjacent to the coupling member where there is less propagation of vibration. Forming outer electrodes over the end surfaces on both sides adjacent to the respective coupling members is more preferable in that it further reduces the influence of reflected waves.

In the exemplary embodiment described above, on the negative side of the X-axis where the coupling member 111b is coupled to the frame 120, the end surfaces of the frame 120, the lid member 200, and the base member 300 are flush with each other in the Y'Z' plane. The arrangement is not limited to this and, for example, the end surfaces described above may be displaced from each other.

The configuration of the outer electrodes according to the present embodiment is applicable in variously modified forms. Modifications of the quartz crystal resonator unit according to the present embodiment will now be described with reference to FIGS. 5 to 13. It is noted that the following description will discuss differences from the embodiment described above.

Figure 5:
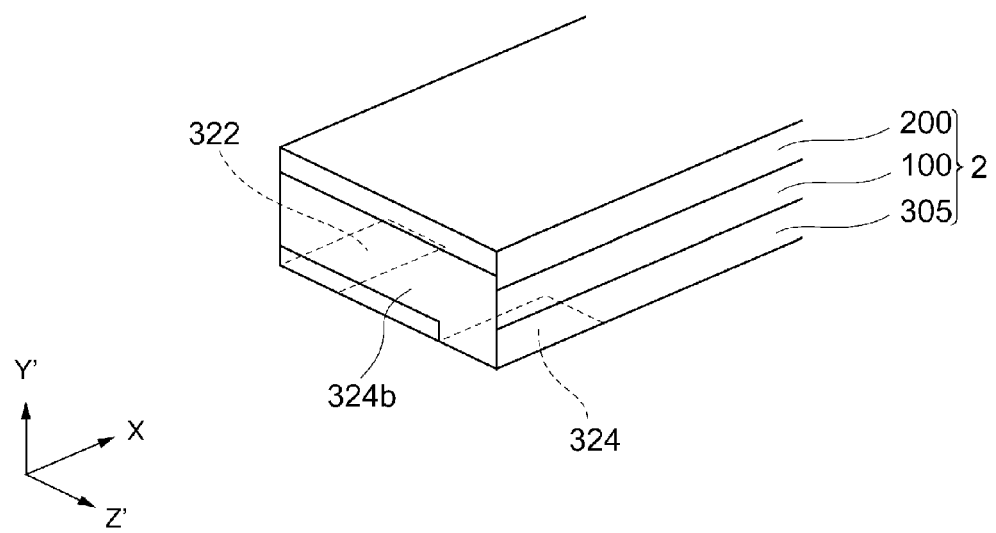
FIG. 5 is a perspective view of a quartz crystal resonator unit according to a modification of the first exemplary embodiment.

FIG. 5 is a perspective view of a quartz crystal resonator unit 2 according to a modification of the present embodiment. The quartz crystal resonator unit 2 includes a base member 305 and, on a surface (mounting surface) of the base member 305 opposite a surface thereof facing the quartz crystal resonator 100, the outer electrodes 322 and 324 are formed on the negative side of the X-axis. In the present modification, only an outer electrode 324b (electrically connected to the outer electrode 324) is formed in the Y'Z' plane in the quartz crystal resonator unit 2, and the present modification differs in this respect from the configuration illustrated in FIG. 4. The outer electrode 324b is formed to extend across the width of the Y'Z' plane of the quartz crystal resonator unit 2 in the Z'-axis direction, and disposed at a predetermined distance from the edge on the positive side of the Y'-axis (i.e., from the upper edge of the lid member 200). That is, the end surface of the lid member 200 is exposed in an area adjacent to the upper edge. The outer electrode 324b is not electrically connected to the outer electrode 322 which is a dummy electrode.

Figure 6:
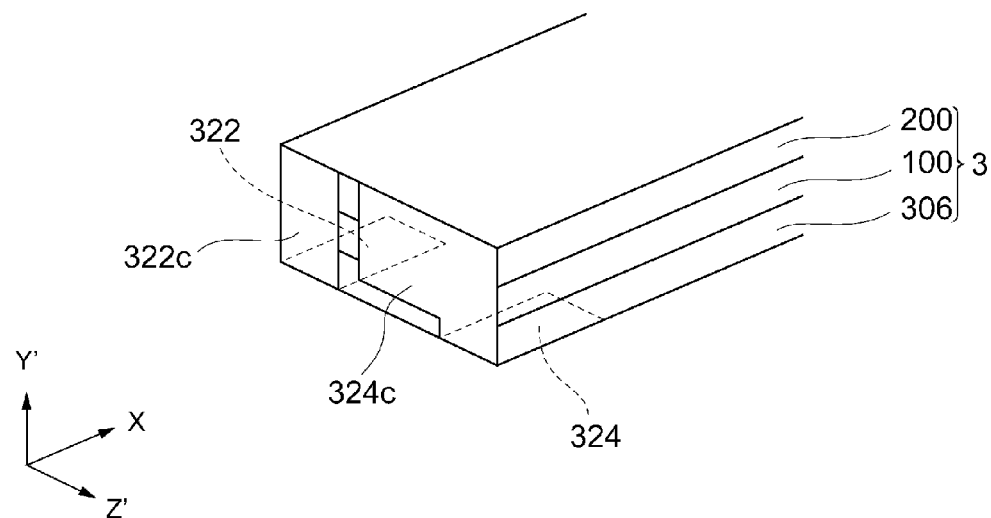
FIG. 6 is a perspective view of a quartz crystal resonator unit according to another modification of the first exemplary embodiment.

FIG. 6 is a perspective view of a quartz crystal resonator unit 3 according to another modification of the present embodiment. The quartz crystal resonator unit 3 includes a base member 306 and, on a surface (mounting surface) of the base member 306 opposite a surface thereof facing the quartz crystal resonator 100, the outer electrodes 322 and 324 are formed on the negative side of the X-axis. An outer electrode 324c and an outer electrode 322c are formed in the Y'Z' plane in the quartz crystal resonator unit 3. The outer electrode 324c is electrically connected to the outer electrode 324 electrically connected to the second excitation electrode, and the outer electrode 322c is electrically connected to the outer electrode 322 which is a dummy electrode. In the present modification, the outer electrodes 324c and 322c are formed to reach the edge in the Y'Z' plane of the quartz crystal resonator unit 3 on the positive side of the Y'-axis (i.e., to reach the upper edge of the end surface of the lid member 200). The present modification differs in this respect from the configuration illustrated in FIG. 4.

Figure 7:
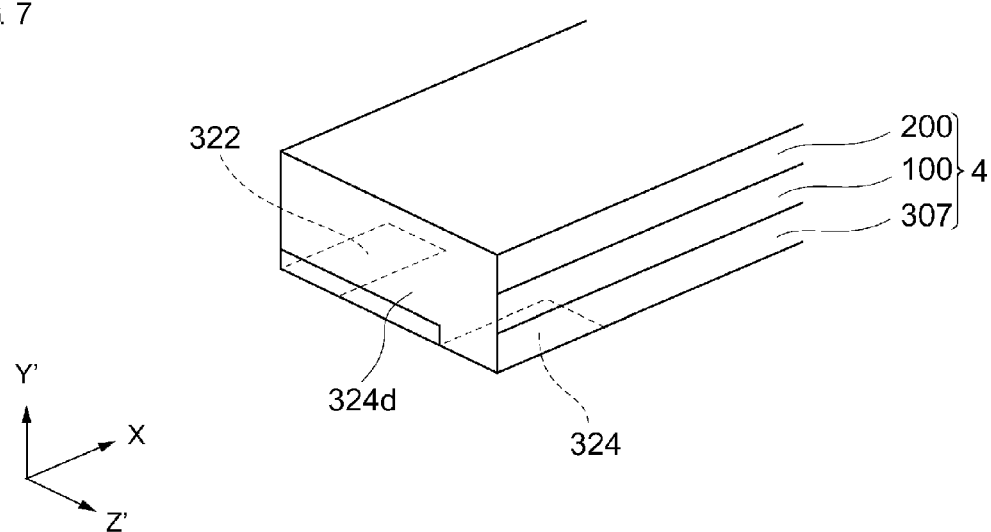
FIG. 7 is a perspective view of a quartz crystal resonator unit according to another modification of the first exemplary embodiment.

FIG. 7 is a perspective view of a quartz crystal resonator unit 4 according to another modification of the present embodiment. The quartz crystal resonator unit 4 includes a base member 307 and, on a surface (mounting surface) of the base member 307 opposite a surface thereof facing the quartz crystal resonator 100, the outer electrodes 322 and 324 are formed on the negative side of the X-axis. An outer electrode 324d (electrically connected to the outer electrode 324) is formed in the Y'Z' plane in the quartz crystal resonator unit 4. In the present modification, the outer electrode 324d is formed to reach the edge in the Y'Z' plane of the quartz crystal resonator unit 4 on the positive side of the Y'-axis (i.e., to reach the upper edge of the end surface of the lid member 200). The present modification differs in this respect from the configuration illustrated in FIG. 5.

Figure 8:
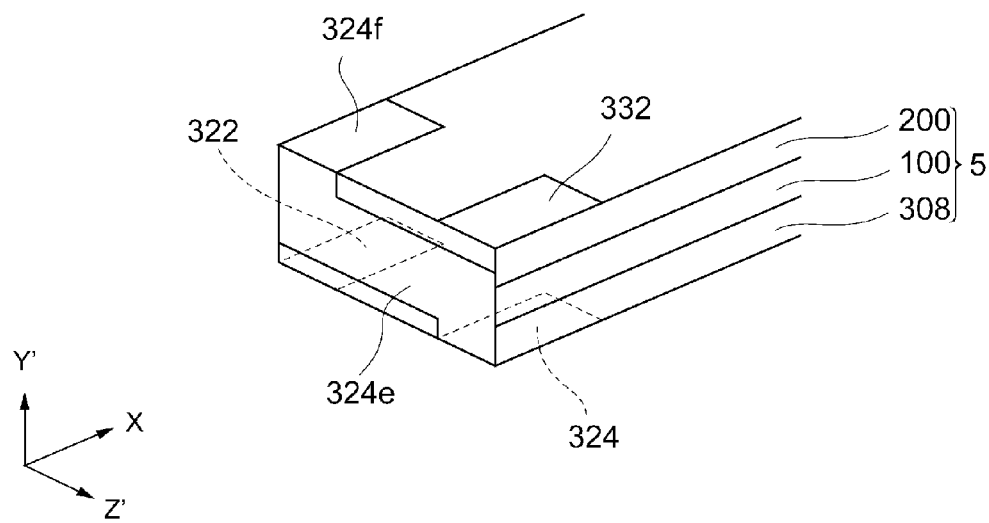
FIG. 8 is a perspective view of a quartz crystal resonator unit according to another modification of the first exemplary embodiment.

FIG. 8 is a perspective view of a quartz crystal resonator unit 5 according to another modification of the present embodiment. The quartz crystal resonator unit 5 includes a base member 308 and, on a surface (mounting surface) of the base member 308 opposite a surface thereof facing the quartz crystal resonator 100, the outer electrodes 322 and 324 are formed on the negative side of the X-axis. An outer electrode 324e (electrically connected to the outer electrode 324) is formed in the Y'Z' plane in the quartz crystal resonator unit 5. Moreover, an outer electrode 324f and an outer electrode 332 are formed on the surface of the lid member 200 opposite the surface thereof facing the quartz crystal resonator 100. The outer electrode 324f is electrically connected to the outer electrode 324e in the Y'Z' plane, and the outer electrode 332 is a dummy electrode that is not electrically connected to any outer electrodes. The outer electrode 324f on the lid member 200 is disposed to coincide with the outer electrode 322 on the base member 308 in the Y'-axis direction, and the outer electrode 332 on the lid member 200 is disposed to coincide with the outer electrode 324 on the base member 308 in the Y'-axis direction. The outer electrodes are thus formed to be rotationally symmetrical about the X-axis of the quartz crystal resonator unit, so that they can be mounted in the same electrode arrangement on the front and back sides. In this exemplary aspect, the outer electrode 322 and the outer electrode 332 are not electrically connected to the outer electrodes 324, 324e, and 324f electrically connected to the second excitation electrode.

Figure 9:
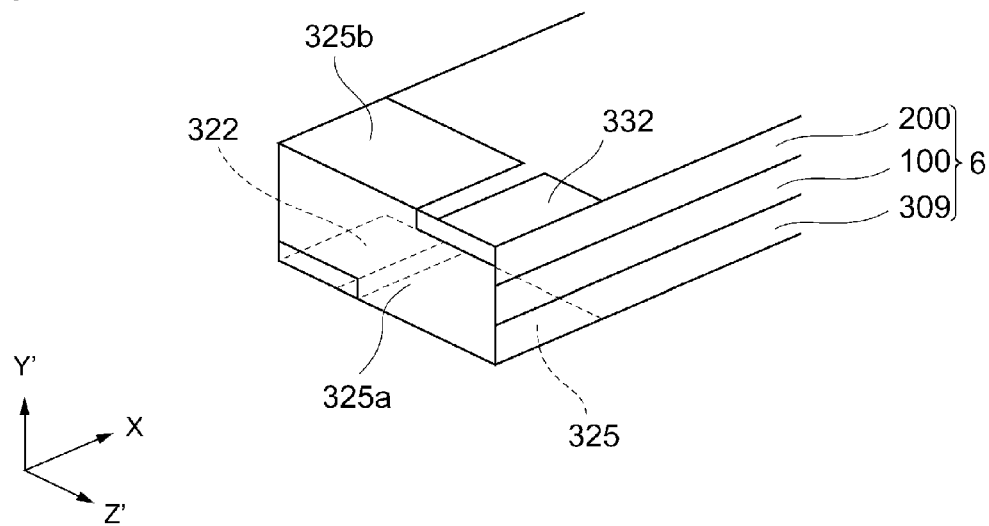
FIG. 9 is a perspective view of a quartz crystal resonator unit according to another modification of the first exemplary embodiment.

FIG. 9 is a perspective view of a quartz crystal resonator unit 6 according to another modification of the present embodiment. The quartz crystal resonator unit 6 includes a base member 309 and, on a surface (mounting surface) of the base member 309 opposite a surface thereof facing the quartz crystal resonator 100, the outer electrode 322 and an outer electrode 325 are formed on the negative side of the X-axis. The outer electrode 325 has the same configuration as the outer electrode 324 except that it is larger in area than the outer electrode 322. An outer electrode 325a (electrically connected to the outer electrode 325) is formed in the Y'Z' plane in the quartz crystal resonator unit 6. An outer electrode 325b and the outer electrode 332 are formed on the surface of the lid member 200 opposite the surface thereof facing the quartz crystal resonator 100. The outer electrode 325b is electrically connected to the outer electrode 325a in the Y'Z' plane, and the outer electrode 332 is a dummy electrode which is not electrically connected to any outer electrodes. The outer electrode 325b on the lid member 200 is disposed on the upper side in the Y'-axis direction to partly overlap the outer electrode 322 on the base member 309, and the outer electrode 332 on the lid member 200 is disposed on the upper side in the Y'-axis direction to partly overlap the outer electrode 325 on the base member 309. The outer electrode 325b on the lid member 200 has substantially the same area as the outer electrode 325 on the base member 309, and is larger in area than the outer electrode 322 and the outer electrode 332 which are dummy electrodes. The present modification differs in this respect from the configuration illustrated in FIG. 8.

Figure 10:
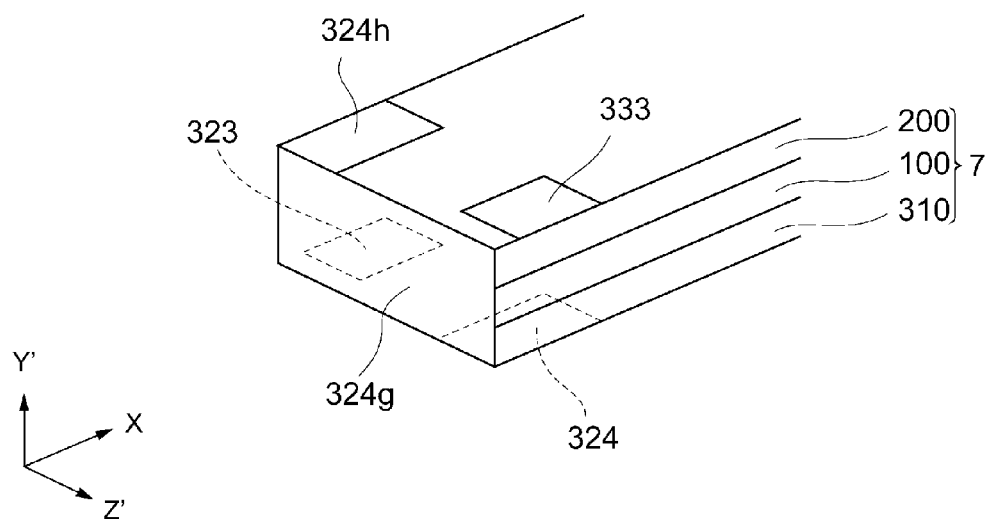
FIG. 10 is a perspective view of a quartz crystal resonator unit according to another modification of the first exemplary embodiment.

FIG. 10 is a perspective view of a quartz crystal resonator unit 7 according to another modification of the present embodiment. The quartz crystal resonator unit 7 includes a base member 310 and, on a surface (mounting surface) of the base member 310 opposite a surface thereof facing the quartz crystal resonator 100, an outer electrode 323 and the outer electrode 324 are formed on the negative side of the X-axis. The outer electrode 323 has the same configuration as the outer electrode 322 except that it is spaced from the Y'Z' plane of the quartz crystal resonator unit 7 as illustrated. An outer electrode 324g (electrically connected to the outer electrode 324) is formed in the Y'Z' plane in the quartz crystal resonator unit 7. An outer electrode 324h and an outer electrode 333 are formed on the surface of the lid member 200 opposite the surface thereof facing the quartz crystal resonator 100. The outer electrode 324h is electrically connected to the outer electrode 324g in the Y'Z' plane, and the outer electrode 333 is a dummy electrode that is not electrically connected to any outer electrodes. The outer electrode 324h on the lid member 200 is disposed on the upper side in the Y'-axis direction to partly overlap the outer electrode 323 on the base member 310, and the outer electrode 333 on the lid member 200 is disposed on the upper side in the Y'-axis direction to partly overlap the outer electrode 324 on the base member 310. Like the outer electrode 323 on the base member 310, the outer electrode 333 on the lid member 200 is spaced from the Y'Z' plane of the quartz crystal resonator unit 7 as illustrated, and the outer electrode 324g is formed over the entire surface in the Y'Z' plane of the quartz crystal resonator unit 7.

Figure 11:
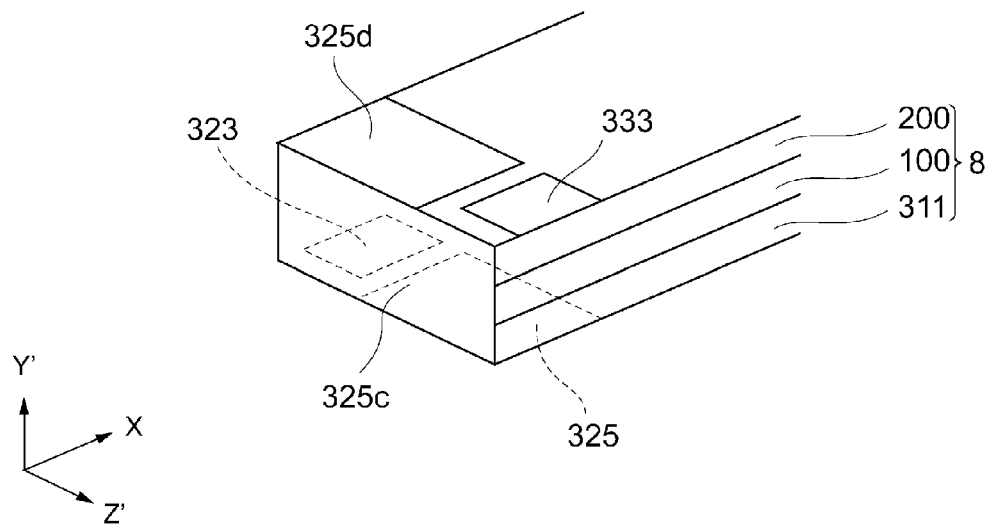
FIG. 11 is a perspective view of a quartz crystal resonator unit according to another modification of the first exemplary embodiment.

FIG. 11 is a perspective view of a quartz crystal resonator unit 8 according to another modification of the present embodiment, and this modification is made by combining the configurations illustrated in FIGS. 9 and 10. The quartz crystal resonator unit 8 includes a base member 311 and, on a surface (mounting surface) of the base member 311 opposite a surface thereof facing the quartz crystal resonator 100, the outer electrodes 325 and 323 are formed on the negative side of the X-axis. An outer electrode 325c (electrically connected to the outer electrode 325) is formed in the Y'Z' plane in the quartz crystal resonator unit 8. An outer electrode 325d and the outer electrode 333 are formed on the surface of the lid member 200 opposite the surface thereof facing the quartz crystal resonator 100. The outer electrode 325d is electrically connected to the outer electrode 325c in the Y'Z' plane, and the outer electrode 333 is a dummy electrode that is not electrically connected to any outer electrodes. The outer electrode 325d on the lid member 200 is disposed on the upper side in the Y'-axis direction to partly overlap the outer electrode 323 on the base member 311, and the outer electrode 333 on the lid member 200 is disposed on the upper side in the Y'-axis direction to partly overlap the outer electrode 325 on the base member 311. The outer electrodes 325 and 325d electrically connected to the second excitation electrode are larger in area than the outer electrodes 323 and 333 which are dummy electrodes. Like the outer electrode 323 on the base member 311, the outer electrode 333 on the lid member 200 is spaced from the Y'Z' plane of the quartz crystal resonator unit 8 as illustrated, and the outer electrode 325c is formed over the entire surface in the Y'Z' plane of the quartz crystal resonator unit 8.

Figure 12:
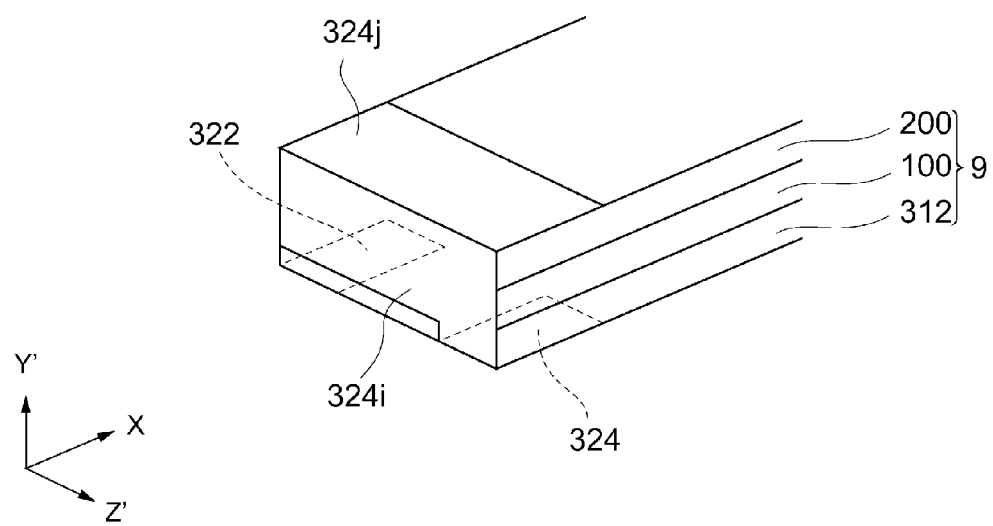
FIG. 12 is a perspective view of a quartz crystal resonator unit according to another modification of the first exemplary embodiment.

FIG. 12 is a perspective view of a quartz crystal resonator unit 9 according to another modification of the present embodiment. The quartz crystal resonator unit 9 includes a base member 312 and, on a surface (mounting surface) of the base member 312 opposite a surface thereof facing the quartz crystal resonator 100, the outer electrodes 322 and 324 are formed on the negative side of the X-axis. An outer electrode 324i (electrically connected to the outer electrode 324) is formed in the Y'Z' plane in the quartz crystal resonator unit 9. The outer electrode 324i is formed to reach the edge in the Y'Z' plane of the quartz crystal resonator unit 9 on the positive side of the Y'-axis (i.e., to reach the upper edge of the end surface of the lid member 200). In the present modification, an outer electrode 324j is formed on the surface of the lid member 200 opposite the surface thereof facing the quartz crystal resonator 100. The present modification differs in this respect from the configuration illustrated in FIG. 7. The outer electrode 324j on the lid member 200 is formed to extend across the width of the XZ' plane of the lid member 200 in the Z'-axis direction. The outer electrode 324j extends toward the positive side of the X-axis to substantially the same length as the outer electrodes 322 and 324 on the base member 312.

Figure 13:
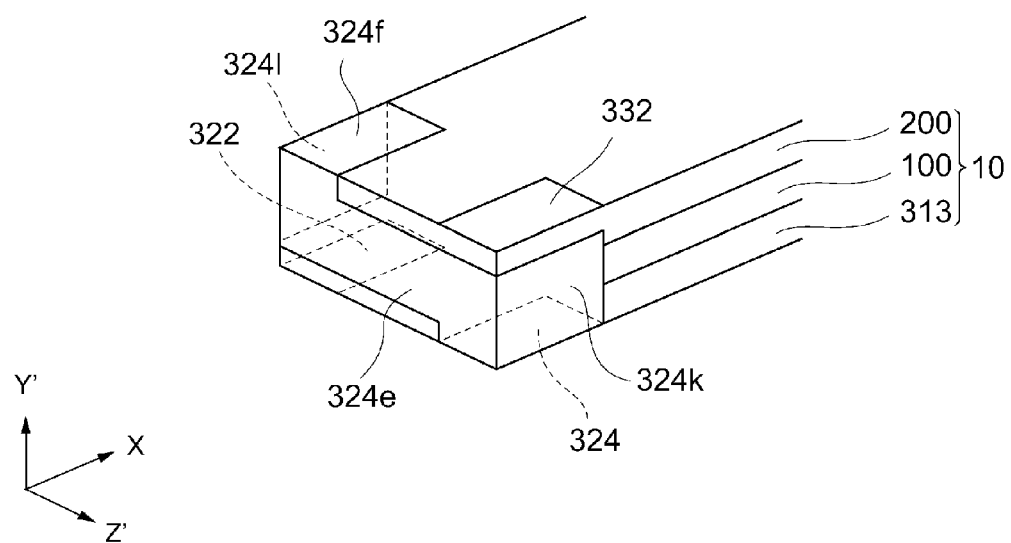
FIG. 13 is a perspective view of a quartz crystal resonator unit according to another modification of the first exemplary embodiment.

FIG. 13 is a perspective view of a quartz crystal resonator unit 10 according to another modification of the present embodiment. The quartz crystal resonator unit 10 includes a base member 313 and, on a surface (mounting surface) of the base member 313 opposite a surface thereof facing the quartz crystal resonator 100, the outer electrodes 322 and 324 are formed on the negative side of the X-axis. An outer electrode 324e (electrically connected to the outer electrode 324) is formed in the Y'Z' plane in the quartz crystal resonator unit 10. The outer electrode 324f and the outer electrode 332 are formed on the surface of the lid member 200 opposite the surface thereof facing the quartz crystal resonator 100. The outer electrode 324f is electrically connected to the outer electrode 324e in the Y'Z' plane, and the outer electrode 332 is a dummy electrode which is not electrically connected to any outer electrodes. The outer electrode 324f on the lid member 200 is disposed to coincide with the outer electrode 322 on the base member 313 in the Y'-axis direction, and the outer electrode 332 on the lid member 200 is disposed to coincide with the outer electrode 324 on the base member 313 in the Y'-axis direction. In the present modification, outer electrodes 324k and 324l are formed in the respective XY' planes of the quartz crystal resonator unit 10 on two sides adjacent to the side of the quartz crystal resonator 100 on the negative side of the X-axis, that is, adjacent to the side where the coupling members 111a and 111b are disposed (see FIG. 1). Specifically, the outer electrode 324k is formed in the XY' plane on the positive side of the Z'-axis, and the outer electrode 324l is formed in the XY' plane on the negative side of the Z'-axis. The XY' planes in the quartz crystal resonator unit 10 are each formed by the end surfaces of the lid member 200, the quartz crystal resonator 100, and the base member 313, and the outer electrodes 324k and 324l each extend in a region extending over the end surfaces of the lid member 200, the quartz crystal resonator 100, and the base member 313. The outer electrode 324k is disposed at a predetermined distance from the upper edge of the lid member 200 so as not to be electrically connected to the outer electrode 332 that is a dummy electrode on the lid member 200. Similarly, the outer electrode 324l is disposed at a predetermined distance from the lower edge of the base member 313 so as not to be electrically connected to the outer electrode 322 which is a dummy electrode on the base member 313.

In any of the modified configurations described above, an outer electrode is formed in at least part of the Y'Z' plane (including a region extending over the end surfaces of the lid member, the quartz crystal resonator, and the base member) in the quartz crystal resonator unit. This attenuates waves reflected from the end portions of the lid member and the base member. The outer electrode preferably covers the Y'Z' plane in the quartz crystal resonator unit as large an area as possible. For example, forming the outer electrode such that it reaches the upper edge (i.e., the edge on the positive side of the Y'-axis) of the end surface (Y'Z' plane) of the lid member 200 (see, e.g., FIGS. 6, 7, 10 to 12) is preferable, because this effectively attenuates waves reflected at the end portion of the lid member 200. When, typically as illustrated in FIG. 12, an outer electrode for attenuating reflected waves is formed along the Y'Z' plane of the quartz crystal resonator unit to reach and extend over the surface of the lid member opposite the surface thereof facing the quartz crystal resonator, the effect of consuming vibration energy propagating through the outer electrode, as well as the effect described above, is achieved and the influence of reflected waves is further reduced. When, as illustrated in FIG. 13, an outer electrode is formed on the end surface of the quartz crystal resonator unit, not only on the side where the coupling members are coupled but also on two sides adjacent thereto, waves reflected from the end portions of the lid member and the base member are more effectively attenuated.

FIGS. 4 to 13 illustrate the configuration of the outer electrodes 324 and 322 in the Y'Z' plane on the negative side of the X-axis. It is noted that the same configuration may be applied to the outer electrodes 328 and 326 in the Y'Z' plane on the positive side of the X-axis. In this case, the outer electrodes may be configured to be rotationally symmetrical about the X-axis and the Z'-axis of the quartz crystal resonator unit.

Second Embodiment

Figure 14:
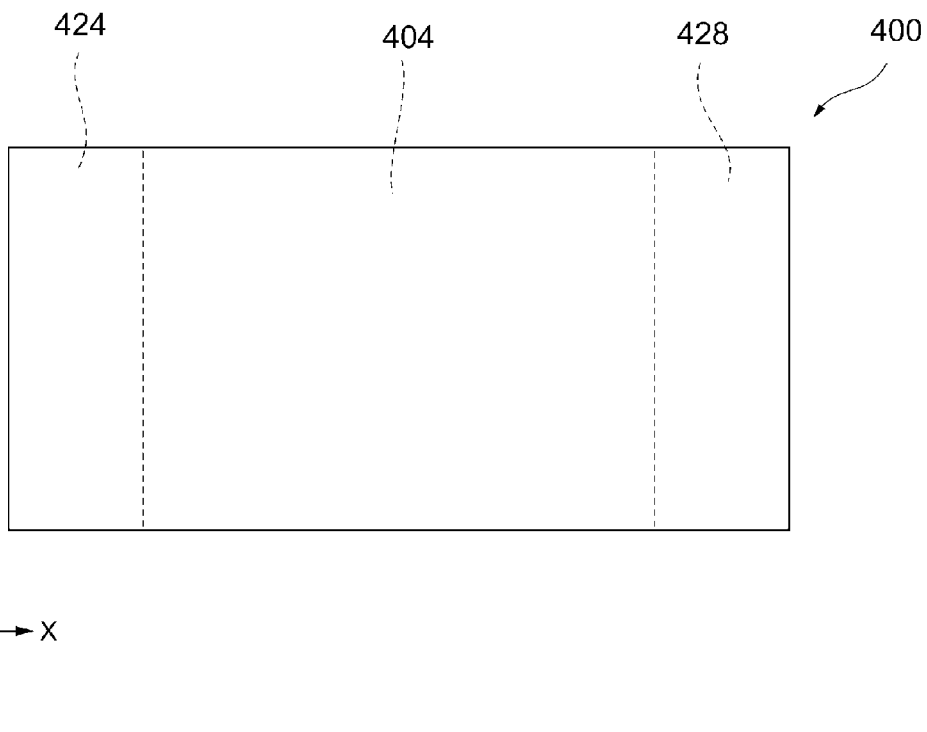
FIG. 14 is a plan view of a base member according to a second exemplary embodiment.

A quartz crystal resonator unit according to a second exemplary embodiment will now be described with reference to FIGS. 14 and 15. In the following embodiment, differences from the first embodiment will be described, and the description of matters that overlap those described above will be omitted. FIG. 14 is a plan view of a base member according to the present embodiment, and FIG. 15 is a perspective view of the quartz crystal resonator unit.

The quartz crystal resonator unit according to the present embodiment differs from the first embodiment in that it has a two-terminal structure composed of two outer electrodes. That is, in the present embodiment, as illustrated in FIG. 14, a second surface 404 of a base member 400 (i.e., a surface of the base member 400 opposite a surface thereof facing the quartz crystal resonator) has, in the X-axis direction along the length of the base member 400, an outer electrode 424 formed at one end on the negative side of the X-axis and an outer electrode 428 formed at the other end on the positive side of the X-axis. The configurations of the quartz crystal resonator 100 and others are the same as those described in the first embodiment (see, e.g., FIG. 1). When the quartz crystal resonator 100 is mounted onto the base member 400, the coupling members 111a and 111b are disposed on the negative side of the X-axis on the base member 400, the outer electrode 428 is electrically connected through the extended electrode 132 to the first excitation electrode 130, and the outer electrode 424 is electrically connected through the extended electrode 142 to the second excitation electrode 140. Note that FIG. 14 is a plan view of the base member 400 as viewed from the side on which the quartz crystal resonator is mounted.

Figure 15:
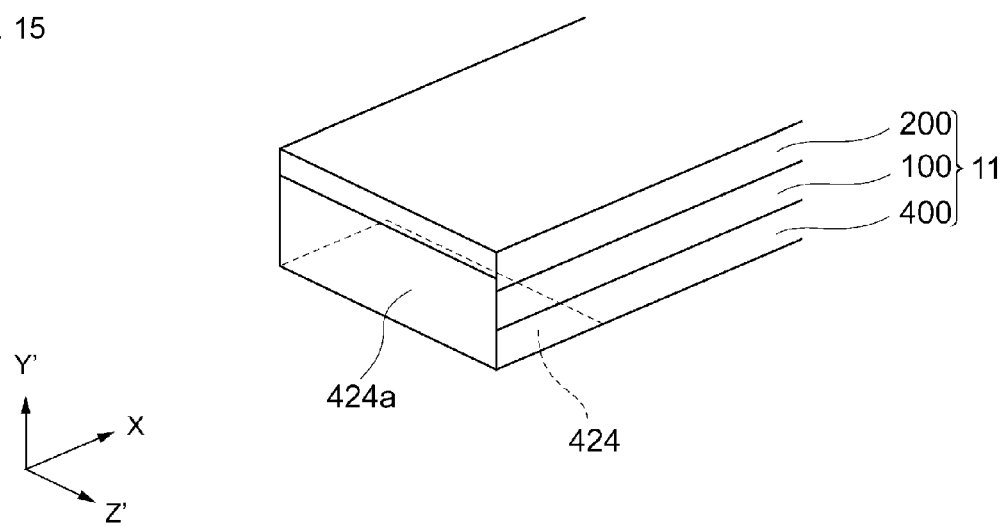
FIG. 15 is a perspective view of a quartz crystal resonator unit according to the second exemplary embodiment.

As illustrated in FIG. 15, an outer electrode 424*a* is formed in the Y'Z' plane in the quartz crystal resonator unit 11, and the outer electrode 424*a* is electrically connected to the outer electrode 424 (electrically connected to the second excitation electrode). The Y'Z' plane in the quartz crystal resonator unit 11 is formed by the end surfaces of the lid member 200, the quartz crystal resonator 100, and the base member 400, and the outer electrode 424*a* extends in a region extending over the end surfaces of the lid member 200, the quartz crystal resonator 100, and the base member 400. The outer electrode 424*a* is disposed at a predetermined distance from the edge in the Y'Z' plane of the quartz crystal resonator unit 11 on the positive side of the Y'-axis (i.e., from the upper edge of the lid member 200). That is, the end surface of the lid member 200 is exposed in an area adjacent to the upper edge.

In this configuration, as in the first embodiment, the outer electrode 424*a* is formed in part of the Y'Z' plane (including the region extending over the end surfaces of the lid member 200, the quartz crystal resonator 100, and the base member 400) in the quartz crystal resonator unit 11. Therefore, part of vibration leaking through the coupling members of the quartz crystal resonator 100 to the lid member 200 and the base member 400 propagates to the outer electrode 424*a* extending continuously over the end surfaces of the quartz crystal resonator 100, the lid member 200, and the base member 400. Since vibration energy propagating to the outer electrode 424*a* is consumed therein and attenuated waves are reflected from the end portion of the outer electrode 424*a*, the influence of the reflected waves is relieved or dispersed.

The configuration of the outer electrodes according to the present embodiment is also applicable in variously modified forms. Modifications of the quartz crystal resonator unit according to the present embodiment will now be described with reference to FIGS. 16 to 18. Note that the following description will discuss differences from the embodiment described above.

Figure 16:
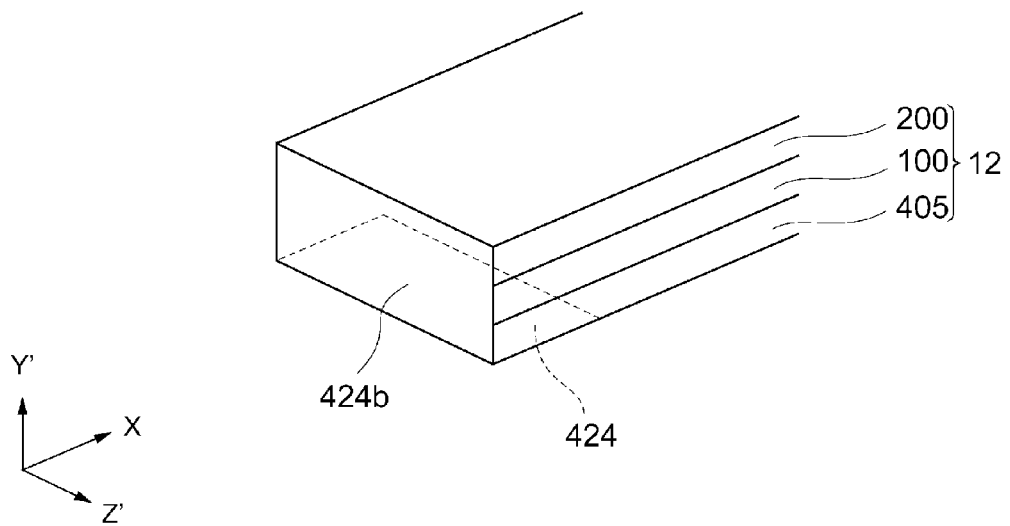
FIG. 16 is a perspective view of a quartz crystal resonator unit according to a modification of the second exemplary embodiment.

FIG. 16 is a perspective view of a quartz crystal resonator unit 12 according to a modification of the present embodiment. The quartz crystal resonator unit 12 includes a base member 405 and, on a surface (mounting surface) of the base member 405 opposite a surface thereof facing the quartz crystal resonator 100, the outer electrode 424 is formed on the negative side of the X-axis. An outer electrode 424*b* (electrically connected to the outer electrode 424) is formed in the Y'Z' plane in the quartz crystal resonator unit 12. In the present modification, the outer electrode 424*b* is formed to reach the edge in the Y'Z' plane of the quartz crystal resonator unit 12 on the positive side of the Y'-axis (i.e., to reach the upper edge of the end surface of the lid member 200). The present modification differs in this respect from the configuration illustrated in FIG. 15.

Figure 17:
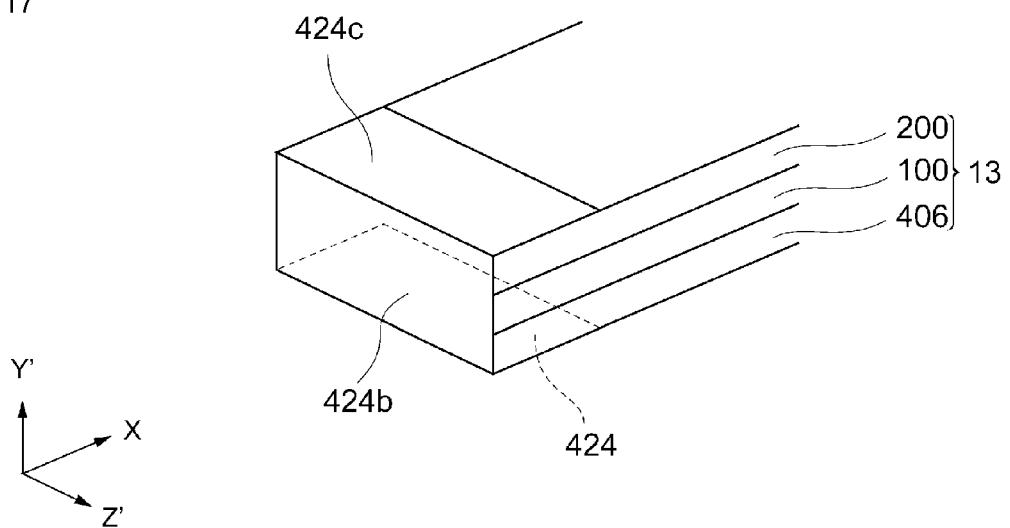
FIG. 17 is a perspective view of a quartz crystal resonator unit according to another modification of the second exemplary embodiment.

FIG. 17 is a perspective view of a quartz crystal resonator unit 13 according to a modification of the present embodiment. The quartz crystal resonator unit 13 includes a base member 406 and, on a surface (mounting surface) of the base member 406 opposite a surface thereof facing the quartz crystal resonator 100, the outer electrode 424 is formed on the negative side of the X-axis. The outer electrode 424*b* (electrically connected to the outer electrode 424) is formed in the Y'Z' plane in the quartz crystal resonator unit 13. The outer electrode 424*b* is formed to reach the edge in the Y'Z' plane of the quartz crystal resonator unit 13 on the positive side of the Y'-axis (i.e., to reach the upper edge of the end surface of the lid member 200). In the present modification, an outer electrode 424*c* is formed on the surface of the lid member 200 opposite the surface thereof facing the quartz crystal resonator 100. The present modification differs in this respect from the configuration illustrated in FIG. 16. The outer electrode 424*c* on the lid member 200 is formed to extend across the width of the XZ' plane of the lid member 200 in the Z'-axis direction. The outer electrode 424*c* extends toward the positive side of the X-axis to substantially the same length as the outer electrode 424 on the base member 406.

Figure 18:
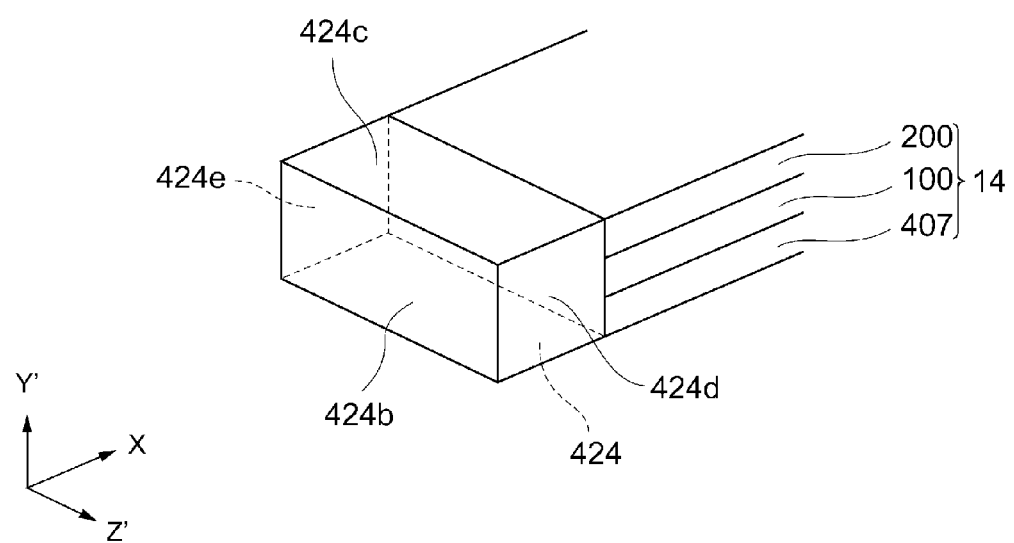
FIG. 18 is a perspective view of a quartz crystal resonator unit according to another modification of the second exemplary embodiment.

FIG. 18 is a perspective view of a quartz crystal resonator unit 14 according to a modification of the present embodiment. The quartz crystal resonator unit 14 includes a base member 407 and, on a surface (mounting surface) of the base member 407 opposite a surface thereof facing the quartz crystal resonator 100, the outer electrode 424 is formed on the negative side of the X-axis. The outer electrode 424*b* (electrically connected to the outer electrode 424) is formed in the Y'Z' plane in the quartz crystal resonator unit 14. The outer electrode 424*c* is formed on the surface of the lid member 200 opposite the surface thereof facing the quartz crystal resonator 100, and the outer electrode 424*c* is electrically connected to the outer electrode 424*b* in the Y'Z' plane. In the present modification, outer electrodes 424*d* and 424*e* are formed in the respective XY' planes of the quartz crystal resonator unit 14 on two sides adjacent to the side of the quartz crystal resonator 100 on the negative side of the X-axis, that is, adjacent to the side where the coupling members 111*a* and 111*b* are disposed (see FIG. 1). Specifically, the outer electrode 424*d* is formed in the XY' plane on the positive side of the Z'-axis, and the outer electrode 424*e* is formed in the XY' plane on the negative side of the Z'-axis. The XY' plane in the quartz crystal resonator unit 14 is formed by the end surfaces of the lid member 200, the quartz crystal resonator 100, and the base member 313, and the outer electrodes 424*d* and 424*e* each extend in a region extending over the end surfaces of the lid member 200, the quartz crystal resonator 100, and the base member 407. The outer electrodes 424*d* and 424*e* are each formed to extend across the width of the XY' plane of the quartz crystal resonator unit in the Y'-axis direction, and extend toward the positive side of the X-axis to substantially the same length as the outer electrodes 424 and 424*c*.

With any of the modified configurations, it is possible as described above to relieve or disperse the influence of reflected waves, suppress unwanted vibration, and thereby improve quality of the quartz crystal resonator unit.

Although an AT-cut quartz crystal resonator having a long-side direction parallel to the X-axis direction and a short-side direction parallel to the Z'-axis direction has been described in the exemplary embodiments (including the modifications), the present invention is not limited to this. For example, the refinements of the exemplary embodiments may be applied to an AT-cut quartz crystal resonator having a long-side direction parallel to the Z'-axis direction and a short-side direction parallel to the X-axis direction. Although a configuration with two coupling members has been described, the number of coupling members is not limited to this. For example, the quartz crystal blank and the frame may be coupled together by one coupling member.

The exemplary embodiments described above are intended to facilitate understanding of the present disclosure, and are not intended to interpret the present invention in a limiting sense. The exemplary embodiments can be changed or improved without departing from the spirit thereof, and includes equivalents thereof. That is, embodiments to which design changes are appropriately made by those skilled in the art are also included in the scope of the present invention, as long as they have the features of the present invention. For example, the elements of the embodiments and their arrangements, materials, conditions, shapes, and sizes are not limited to the illustrated ones and can be changed appropriately. The elements of the embodiments may be combined as long as it is technically possible, and combinations of the elements are also included in the scope of the present invention, as long as they have the features of the present invention.

REFERENCE SIGNS LIST 1 to 14: quartz crystal resonator unit
100: quartz crystal resonator
110: quartz crystal blank
111a, 111b: coupling member
130: first excitation electrode
140: second excitation electrode
200: lid member
300, 305 to 313: base member
324, 324a to 324l: outer electrode
325, 325a to 325d: outer electrode
400, 405 to 407: base member
424, 424a to 424e: outer electrode

The invention claimed is:

1. A quartz crystal resonator unit comprising:
a quartz crystal resonator including a quartz crystal blank having a first and second excitation electrodes disposed on first and second surfaces of the quartz crystal blank, respectively, a frame that surrounds an outer periphery of the quartz crystal blank, and a coupling member that couples the frame to the quartz crystal blank;
a lid member disposed to face the first surface of the quartz crystal blank and coupled to an entire circumference of the frame; and
a base member disposed to face the second surface of the quartz crystal blank and coupled to the entire circumference of the frame, such that the quartz crystal blank is disposed between the lid member and the base member; and
a plurality of outer electrodes that are electrically connectable to an external unit, the plurality of outer electrodes being disposed on an outer surface of the base member opposite a surface of the base member facing the quartz crystal resonator,
wherein a first outer electrode of the plurality of outer electrodes is electrically connected to the first excitation electrode and a second outer electrode of the plurality of outer electrodes is electrically connected to the second excitation electrode,
wherein at least one of the first and second outer electrodes extends over respective end surfaces of the frame, the lid member, and the base member on a side of the quartz crystal resonator unit where the coupling member is disposed, the at least one first or second outer electrode having a machinery quality factor Qm smaller than a machinery quality factor of the frame,
wherein a connection electrode is disposed on a surface of the frame and is electrically connected to either the first or second excitation electrode, and
wherein the connection electrode extends to an outer edge of the frame and is connected to the at least one first or second outer electrode that extends over the end surfaces of the frame, the lid member, and the base member.

2. The quartz crystal resonator unit according to claim 1, wherein the lid member and the base member each comprise quartz crystal or glass.

3. The quartz crystal resonator unit according to claim 1, wherein the at least one first or second outer electrode that extends on the side of the quartz crystal resonator unit extends to reach an edge of the end surface of the lid member.

4. The quartz crystal resonator unit according to claim 1, wherein the at least one first or second outer electrode extends over the end surface of the lid member and also extends over at least a portion of a surface of the lid member opposite a surface of the lid member facing the quartz crystal resonator.

5. The quartz crystal resonator unit according to claim 1, wherein the frame, the lid member, and the base member are substantially rectangular in an outer shape in a plan view of the quartz crystal resonator unit.

6. The quartz crystal resonator unit according to claim 5, wherein the end surfaces of the frame, the lid member, and the base member are flush with each other at least on the side where the coupling member is disposed, and wherein the at least one first or second outer electrode covers the end surfaces of the frame, the lid member, and the base member flush with each other.

7. The quartz crystal resonator unit according to claim 5, wherein the at least one first or second outer electrode extends over the end surfaces of the frame, the lid member, and the base member on a corresponding one of two sides of the frame, wherein the two sides are adjacent and extend in an orthogonal direction relative to the side where the coupling member is disposed.

8. The quartz crystal resonator unit according to claim 1, wherein the lid member and the base member each are a flat plate.

9. The quartz crystal resonator unit according to claim 1, wherein a portion of the quartz crystal blank where the first and second excitation electrodes are disposed has a thickness, excluding the first and second excitation electrodes, that is equal to a thickness of the frame.

10. The quartz crystal resonator unit according to claim 1, wherein the machinery quality factor Qm of the at least one first or second outer electrode is smaller than a machinery quality factor of both the lid member and the base member.

11. The quartz crystal resonator unit according to claim 1, wherein the frame, the lid member, and the base member define an internal vacuum space with the quartz crystal resonator disposed therein.

12. The quartz crystal resonator unit according to claim 1, wherein a thickness of the coupling member is less than a thickness of the quartz crystal blank.

13. The quartz crystal resonator unit according to claim 1, wherein the plurality of outer electrodes includes a dummy electrode that is not electrically connected to either of the first and second excitation electrodes.

14. The quartz crystal resonator unit according to claim 1, further comprising first and second sealing members respectively coupling the lid member and the base member to opposing surfaces of the frame.

15. The quartz crystal resonator unit according to claim 14, wherein the first and second sealing members each have a recess extending inward from an end surface of the quartz crystal resonator, and wherein the at least one first or second outer electrode fills at least one of the recesses of the first and second sealing members.

16. The quartz crystal resonator unit according to claim 14, wherein the connection electrode is directly disposed between the surface of the frame and one of the first and second sealing members.

17. The quartz crystal resonator unit according to claim 1,
wherein the at least one first or second outer electrode has a first electrode layer on the end surfaces of the frame, the lid member, and the base member and a second electrode layer disposed outside the first electrode layer, and
wherein the first electrode layer has an acoustic impedance between an acoustic impedance of the second electrode layer and an acoustic impedance of a quartz crystal of the quartz crystal resonator.

18. The quartz crystal resonator unit according to claim 1, wherein the plurality of outer electrodes consists of four outer electrodes disposed at four corners of the outer surface of the base member, respectively.

19. A quartz crystal resonator unit comprising:
a quartz crystal resonator including a quartz crystal blank with first and second excitation electrodes disposed on opposing surfaces of the quartz crystal blank, a frame that surrounds an outer periphery of the quartz crystal blank, and a first coupling member and a second coupling member that respectively couple the frame to the quartz crystal blank;
a lid member and a base member each coupled to an entire circumference of the frame, such that the quartz crystal blank is disposed between the lid member and the base member; and
a plurality of outer electrodes disposed on an outer surface of at least one of the base member and the lid member,
wherein a first outer electrode of the plurality of outer electrodes is electrically connected to the first excitation electrode via the first coupling member and a second outer electrode of the plurality of outer electrodes is electrically connected to the second excitation electrode via the second coupling member,
wherein at least one of the first and second outer electrodes is coupled to the respective first or second excitation electrodes by a connection electrode that extends to an outer edge of the frame on a side of the quartz crystal resonator to connect the at least one first or second outer electrode to the respective first or second excitation electrodes via the respective coupling member, and
wherein a machinery quality factor Qm of the at least one first or second outer electrode is smaller than a machinery quality factor of the frame, the lid member and the base member.

* * * * *